United States Patent [19]

Oowaki et al.

[11] Patent Number: 5,463,577
[45] Date of Patent: Oct. 31, 1995

[54] SEMICONDUCTOR MEMORY

[75] Inventors: Yukihito Oowaki; Takehiro Hasegawa, both of Yokohama, Japan

[73] Assignee: Kabushiki Kaisha Toshiba, Kawasaki, Japan

[21] Appl. No.: 365,104

[22] Filed: Dec. 28, 1994

[30] Foreign Application Priority Data

Dec. 28, 1993 [JP] Japan .................................. 5-336667
Nov. 18, 1994 [JP] Japan .................................. 6-285279

[51] Int. Cl.$^6$ .................................................. G11C 11/24
[52] U.S. Cl. .......................... 365/63; 365/51; 365/149; 365/230.03
[58] Field of Search .............................. 365/149, 230.03, 365/189.12, 174, 63, 51

[56] References Cited

U.S. PATENT DOCUMENTS

| 5,309,393 | 5/1994 | Sakata et al. ................. 365/230.03 |
| 5,317,540 | 5/1994 | Furuyama . | |
| 5,341,326 | 8/1994 | Takase et al. ..................... 365/149 |
| 5,369,612 | 11/1994 | Furuyama ......................... 365/149 |

OTHER PUBLICATIONS

ISSCC 93/Session 3/Non–Volatile, Dynamic, and Experimental Memories/Paper WP 3.5 1993 Feb. 24; T. Sugibayashi, et al.; pp. 50–51; "A 30ns 256Mb DRAM with Multi–Divided Array St Structure".

ISSCC 93/Session 3/Non–Volatile, Dynamic, and Experimental Memories/paper WP 3.3 1993 Feb. 24; T. Hasegawa, et al.; "An Experimental DRAM with a NAND–Structured Cell" pp. 46–47.

*Primary Examiner*—David C. Nelms
*Assistant Examiner*—Vu A. Le
*Attorney, Agent, or Firm*—Oblon, Spivak, McClelland, Maier & Neustadt

[57] ABSTRACT

There is provided a semiconductor memory having a reduced power consumption in data access and a high access speed in a NAND cell array scheme in which a memory cell unit is constituted by cascade-connecting a plurality of memory cells with each other. A memory cell array is divided into a plurality of sub-arrays, and the divided sub-arrays are selectively activated, thereby decreasing the capacitances of the word lines, register word lines, bit lines, and the like which are charged/discharged in data access.

27 Claims, 12 Drawing Sheets

SEMICONDUCTOR MEMORY

BACKGROUND OF THE INVENTION

1. Field of the Invention

The present invention relates to a semiconductor memory and, more particularly, to a semiconductor memory having an array of memory cell units each constituted by cascade-connecting a plurality of memory cells with each other.

2. Description of the Related Art

There is conventionally known a DRAM which has a memory cell array arranged by a scheme in which NAND memory cell units are formed by cascade-connecting a plurality of memory cells with each other, and the plurality of memory cell units are connected to a bit line. In this cell array scheme, the number of bit line contacts is smaller than that in a scheme in which memory cells are respectively connected to bit lines. For this reason, a cell area can be advantageously decreased.

In this NAND cell array scheme, in order to read out data from a memory cell far away from a bit line, the data of the memory cell closer to the bit line than the above memory cell is broken. For this reason, registers for temporarily storing the data of the memory cell units and writing the data again are required (for example, IEEE ISSCC DIGEST OF TECHNICAL PAPERS, VOL. 34, p. 106, TAM 6.2, 1991).

Figure 1:
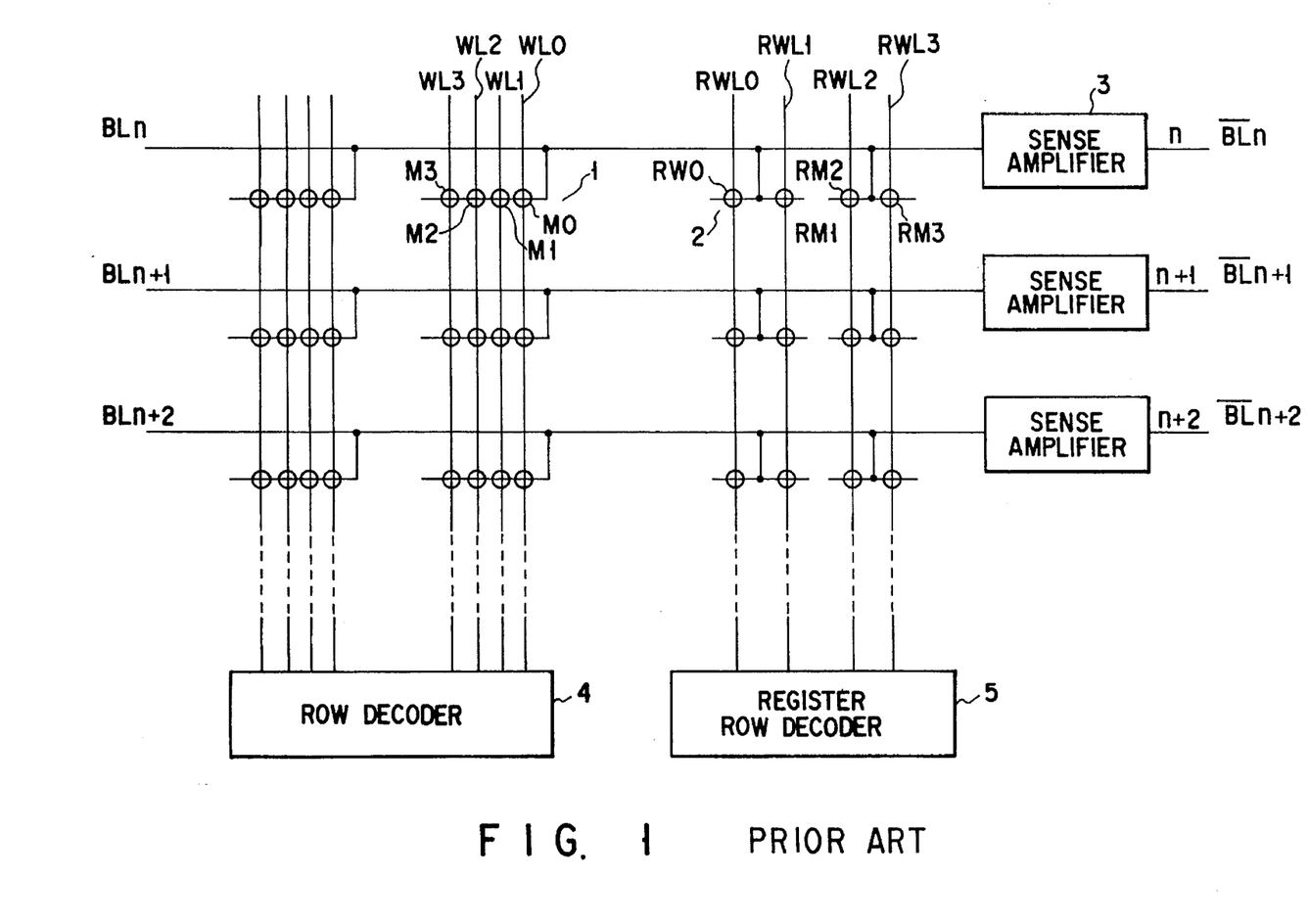
FIG. 1 is a view showing the arrangement of a memory cell unit, a register cell array, and sense amplifiers arranged in a conventional semiconductor memory.

FIG. 1 shows a semiconductor memory using a conventional NAND cell array scheme. Referring to FIG. 1, reference numeral 1 denotes a NAND array constituted by cascade-connecting, e.g., four memory cells M with each other; 2, a register cell array constituted by four memory cells RM corresponding to the memory cells M; 3, sense amplifiers; 4, a row decoder; and 5, a register row decoder.

In this memory, in order to read the data of one memory cell unit and write the data again, the following operations are performed. That is, a word line WL0 is activated, the data of a memory cell M0 is sensed, and bit lines BL are charged/discharged. In addition, a register cell word line RWL0 is activated, the data of the memory cell M0 is transferred to a register cell RM0, and the register cell word line RWL0 is de-activated, thereby securing the data of the register cell RM0. For this reason, in order to read out 1-bit data from a memory cell M and transfer it to a register RM, a word line WL is activated once, a register cell word line RWL is activated once and de-activated once. In addition, in order to write 1-bit data in the memory cell again, the register cell word line RWL is activated once and de-activated once, and the word line WL is de-activated once.

Figure 2:
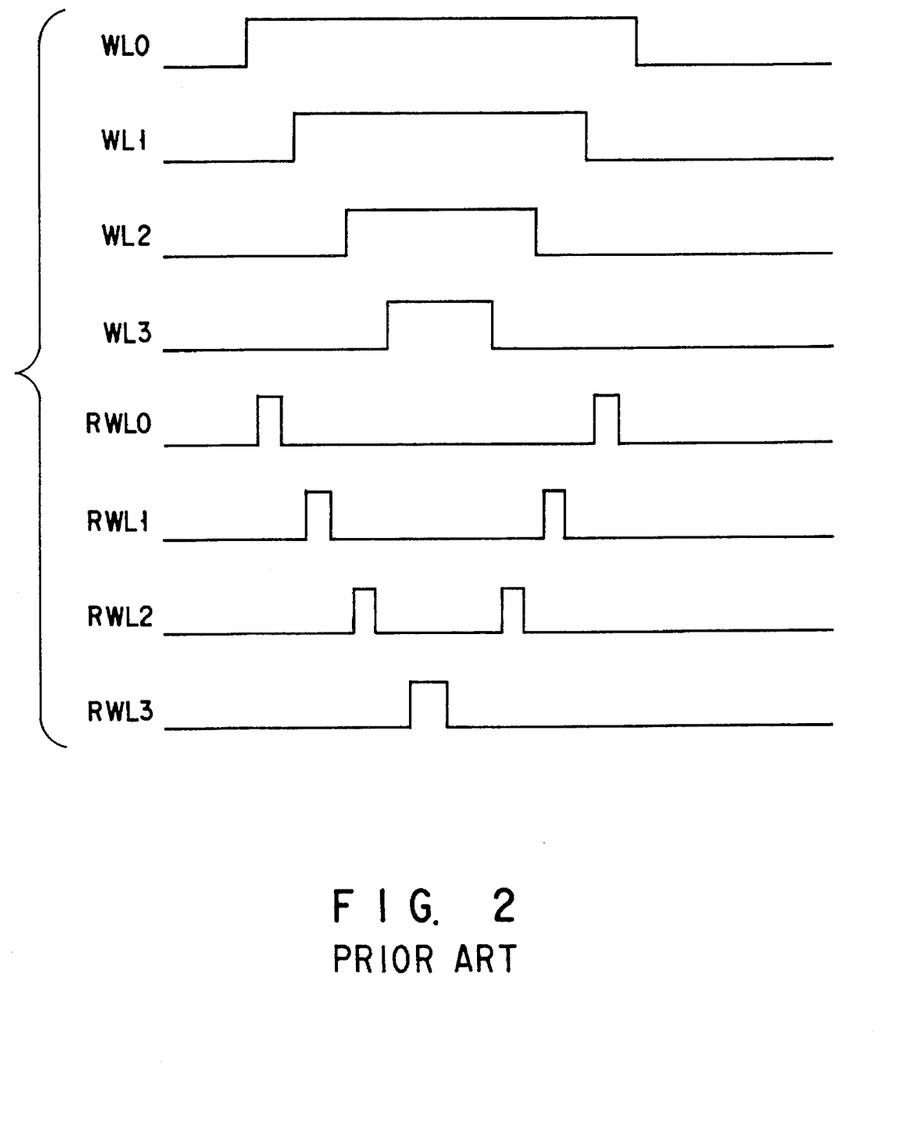
FIG. 2 is a signal waveform chart for explaining an operation performed in data access in a prior art.

Therefore, in a cell in which one unit is constituted by four bits, as shown in FIG. 2, four word lines are activated once and de-activated once, and four register word lines are activated twice and de-activated twice (although a register word line RWL3 may be activated once and de-activated once), and each bit line is charged/discharged times corresponding to the number of times of activation of the register word lines. For this reason, currents required for charging/discharging the word lines, the register word lines, and the bit lines are considerably increased, and a time required for accessing a memory cell is disadvantageously prolonged.

SUMMARY OF THE INVENTION

It is an object of the present invention to provide a semiconductor memory having a reduced power consumption in data access and a high access speed in a NAND cell array scheme in which a memory cell unit is constituted by cascade-connecting a plurality of memory cells with each other.

The gist of the present invention is as follows. That is, a memory cell array is divided into a plurality of sub-arrays, and the divided sub-arrays are selectively activated, thereby decreasing the capacitances of the word lines, register word lines, bit lines, and the like which are charged/discharged in data access.

More specifically, according to the present invention, there is provided a semiconductor memory comprising:

a semiconductor substrate;

a memory cell array constituted by a plurality of memory cell units arranged on the semiconductor substrate in row and column directions,
the memory cell units being arranged on the semiconductor substrate in rows and columns and each constituted by cascade-connecting a predetermined number of memory cells with each other, each of the memory cells being addressed by having a row address and a column address;

a plurality of bit lines to which the plurality of memory cell units are coupled in a column direction;

a plurality of sub word lines to which the plurality of memory cells are selectively coupled in a row direction;

a plurality of main word lines each of which selects a group of the sub word lines related to a memory cell unit in the memory cell arrays;

a plurality of register arrays in each of which a plurality of register cells for temporarily storing memory cell data read out from the plurality of memory cell units onto the bit lines are arranged;

a plurality of sense amplifiers for detecting the memory cell data;

a main row decoder for receiving the row address and selectively activating a corresponding one of the main word lines;

a main register row decoder for activating register word lines of the register arrays;

a sub-array decoder for receiving the column address and activating corresponding sense amplifiers from the sense amplifiers;

a plurality of sub-row decoders respectively connected to a plurality of memory cell sub-arrays obtained by dividing the memory cell array,
each of the sub-row decoders being connected to the sub-array decoder and the main row decoder for selectively activating a corresponding one from the sub word lines; and a plurality of sub-register row decoders respectively connected to a plurality of register sub-arrays obtained by dividing the register array in correspondence with the plurality of memory cell sub-arrays,
each of the sub-register row decoders being connected to the sub-array decoder and the register row decoder, and the register sub-arrays being respectively connected to the sense amplifiers, wherein the memory cell sub-arrays and the register sub-arrays are selectively driven by the sub-array decoder.

As preferable embodiments of the present invention, the followings are provided. That is:

(1) In accessing an arbitrary memory cell unit in sub-arrays, after both row and column addresses are received by a chip from the outside of a memory, a sub-array having a memory cell unit extracted by the addresses is selectively activated.

(2) In accessing to an arbitrary memory cell unit in sub-arrays, when a row address is received by a chip when a first memory cell is to be accessed from a bit line, all sub-arrays corresponding to the row address are activated, and the data of the sub-arrays are read out to sub-array sense amplifiers. Thereafter, subsequently data corresponding to a column address externally input to the chip is read out to an output terminal. The second and sequential memory cells are activated in only a sub-array which is designated in advance.

According to the present invention, an array of memory cells and an array of register cells are respectively divided into pluralities of sub-arrays, and the divided sub-arrays are selectively driven. For this reason, the capacitances of word lines, register word lines, bit lines, and the like which are operated in data access become very small. Therefore, currents for charging/discharging the word lines, the register word lines, the bit lines, and the like are decreased, so that a power consumption can be considerably reduced. For example, in a 64-Mbit DRAM, when an array is divided into sub-arrays each having several 10 kbits to several 100 kbits, power consumption can be reduced to approximately 1/10.

In addition, all the sub-arrays are activated in accessing the first memory cell in a memory cell unit, and one sub-array is activated in accessing to the second and sequential memory cells, so that high-speed data access and a reduction in power consumption can be realized.

According to the present invention, the capacitances of word lines used when a memory cell is accessed can be smaller than the capacitances of conventional word lines. For this reason, the word lines can be activated at a high speed. At the same time, the number of activated bit lines is smaller than the number of conventional activated bit lines. Therefore, the bit lines can be charged/discharged at a high speed, i.e., read access and write access can be performed at a high speed, and a memory cell can be accessed at a speed higher than a conventional speed by about 10%.

According to the arrangement (1), power consumption can be decreased compared with the arrangement (2). According to the arrangement (2), the first cell can be accessed within a time shorter than a time in the arrangement (1) by a time required for causing the memory to wait for a column address input.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.
(First Embodiment)

Figure 3:
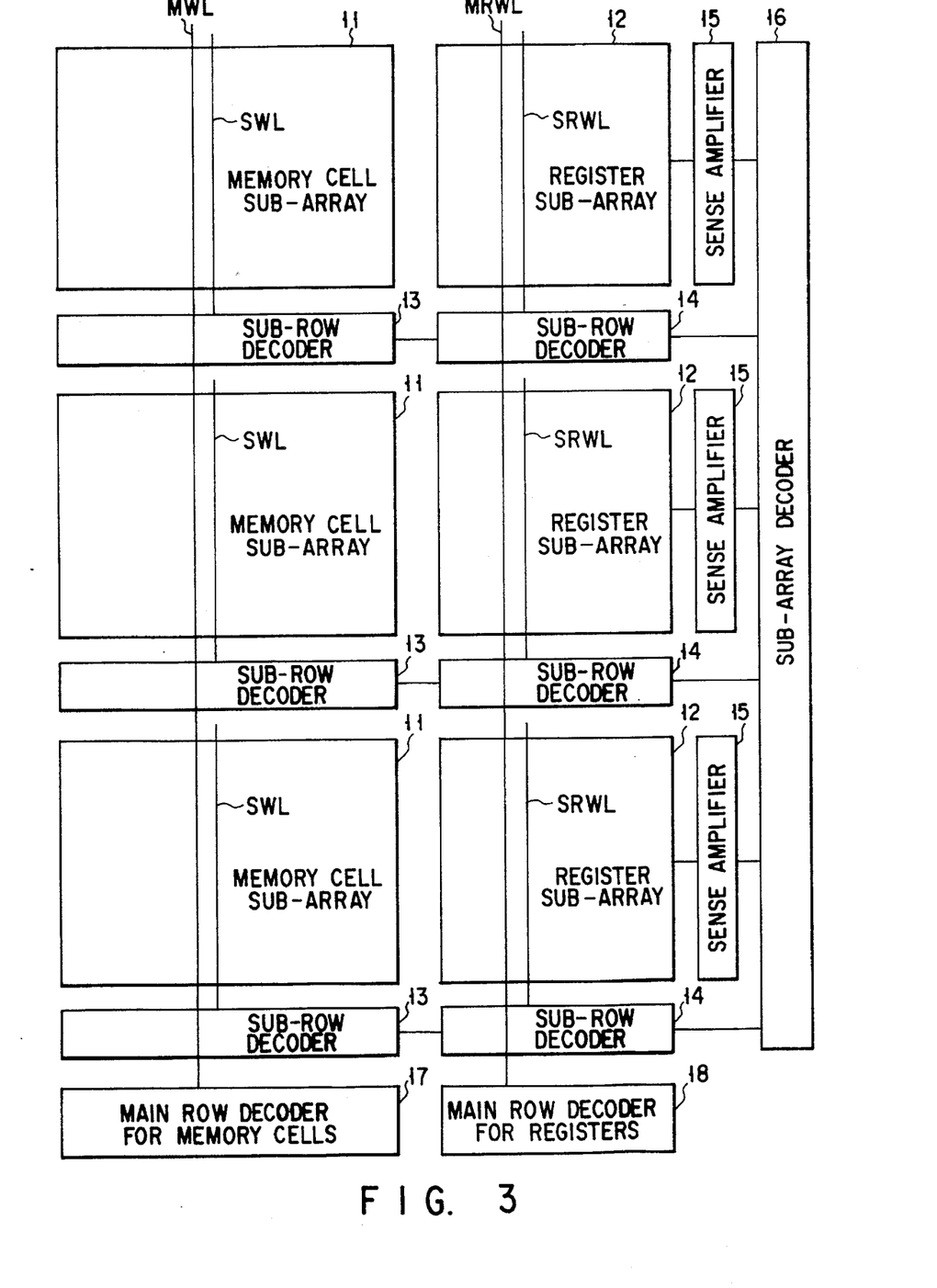
FIG. 3 is a schematic block diagram showing the arrangement of a semiconductor memory according to the first embodiment of the present invention.

FIG. 3 is a schematic block diagram showing the arrangement of a semiconductor memory according to the first embodiment of the present invention. NAND memory cell units each obtained by cascade-connecting memory cells with each other or by memory cells connected in series, so as to have a bit line contact for each unit, are arranged in a matrix to constitute an array. This array is divided to form a plurality of sub-arrays 11. A register cell array is divided in correspondence with the dividing operation of the memory cell array, thereby forming register sub-arrays 12.

A sub-row decoder 13 is connected to each memory cell sub-array 11, and a register sub-row decoder 14 is connected to each register sub-array 12. A sub-array sense amplifier 15 is connected to each sub-array 11 and each sub-array 12. The sub-row decoder 13 selects a sub-word line SWL, and a memory cell is connected to the sub-word line SWL. The sub-row decoder 14 selects a sub-register word line SRWL, and a register cell is connected to the sub-register word line SRWL.

In each sub-array 11 and each sub-array 12, the sub-row decoder 13, the register sub-row decoder 14, and the sub-array sense amplifier 15 are selected by a sub-array decoder 16. A column address signal is externally input to the sub-array decoder 16 through an address buffer (not shown). A main word line MWL is selected by a main row decoder 17, and is connected to the sub-row decoder to drive it. A row address signal is externally input to the main row decoder 17 through an address buffer (not shown). Similarly, a main register word line MRWL is selected by a main register row decoder 18, and is connected to the register sub-row decoder to drive it. A signal from an internal counter circuit (not shown) synchronized with an address signal is input to the main register row decoder.

Figure 4:
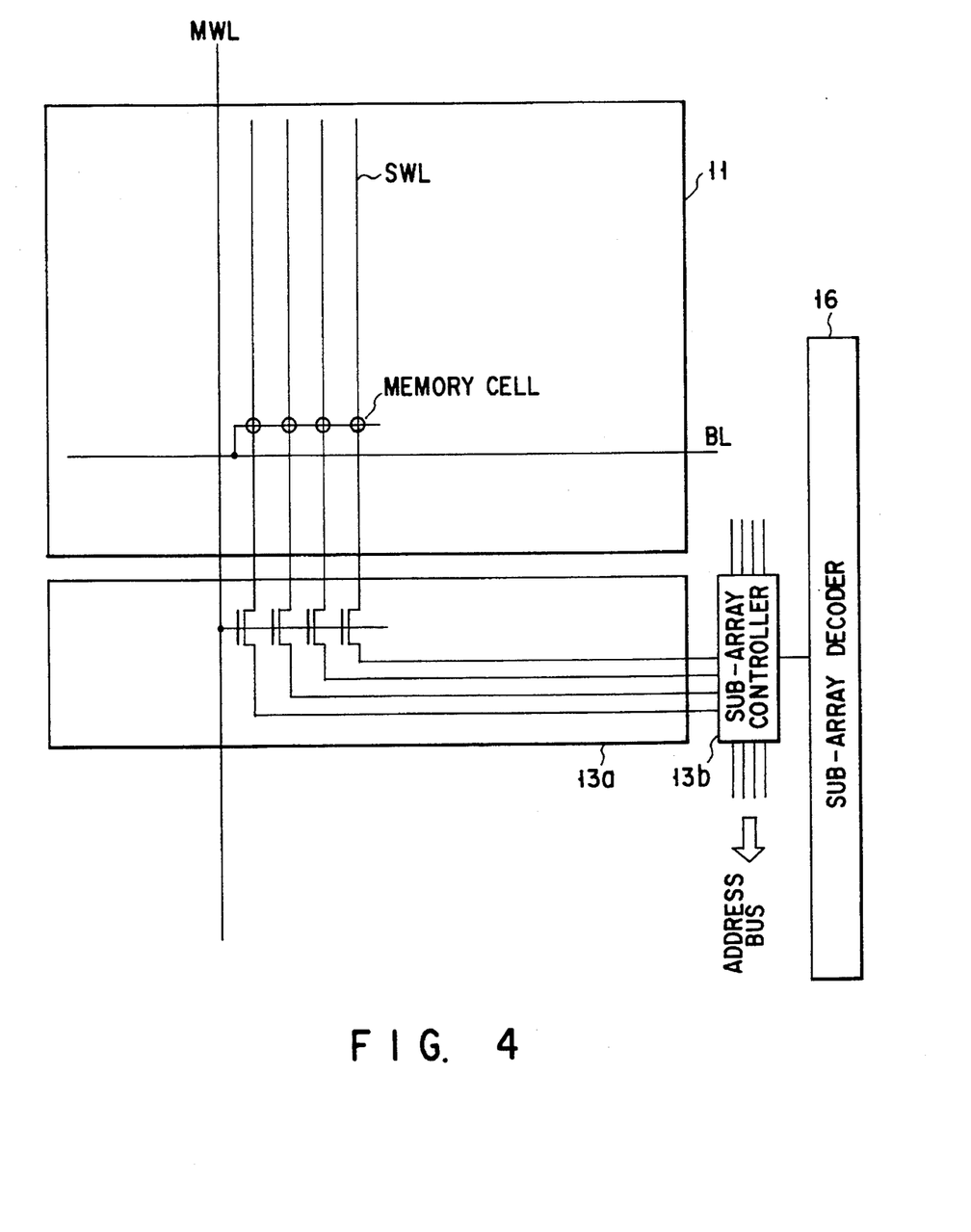
FIG. 4 is a view showing the sub-array and the sub-row decoder in the first embodiment.

FIG. 4 is a view showing the detailed connection relationship between the memory cell sub-array 11 and the sub-row decoder 13. The sub-row decoder 13 is constituted by a plurality of switching element circuits 13a and a plurality of sub-array controllers 13b. The switching elements of the switching element circuit 13a are driven by a main word line MWL to connect the sub-word lines SWL to the sub-array controllers 13b. The sub-array controller 13b selected by the sub-array decoder 16 selects one of the sub-word lines SWL by a signal input from an address bus. In this manner, any one of the sub-word lines SWL is selected by the selecting operations of the main word line MWL and the sub-array decoder 16.

Although four sub-word lines SWL are arranged to correspond to one main word line MWL, one sub-word line SWL may be arranged to correspond to one main word line MWL, and the number of sub-word lines SWL is not limited to four. In addition, the register sub-row decoder 14 may have an arrangement identical to that of the sub-row decoder 13.

In this embodiment, the main row decoder 17 selects the main word line MWL in accordance with a row address input, and the sub-word line SWL determined by the main word line MWL and the sub-array decoder 16 is selected in accordance with a sub-array decoder input. The data of memory cells connected to the sub-word line SWL are read out onto a bit line BL, and data is selectively sensed by the sub-array sense amplifier 15 to charge and discharge the bit line BL. In this case, the sub-word lines SWL of the remaining sub-arrays which are not selected by the sub-array decoder 16 and the sub-register word lines of the remaining sub-arrays are not operated, so the bit lines BL of the corresponding sub-arrays are not charged and discharged.

As described above, according to this embodiment, in data access, the overall memory cell array is not driven at once, but only a sub-array is selected by the main row decoder 17 and the sub-array decoder 16. For this reason, the capacitances of a word line and a register word line which are driven in data access become considerably smaller than those obtained by a conventional technique, and a smaller current is required to charge and discharge the word line and register word line. Therefore, in a NAND cell array scheme, power consumption in data access can be considerably decreased.

(Second Embodiment)

Figure 5:
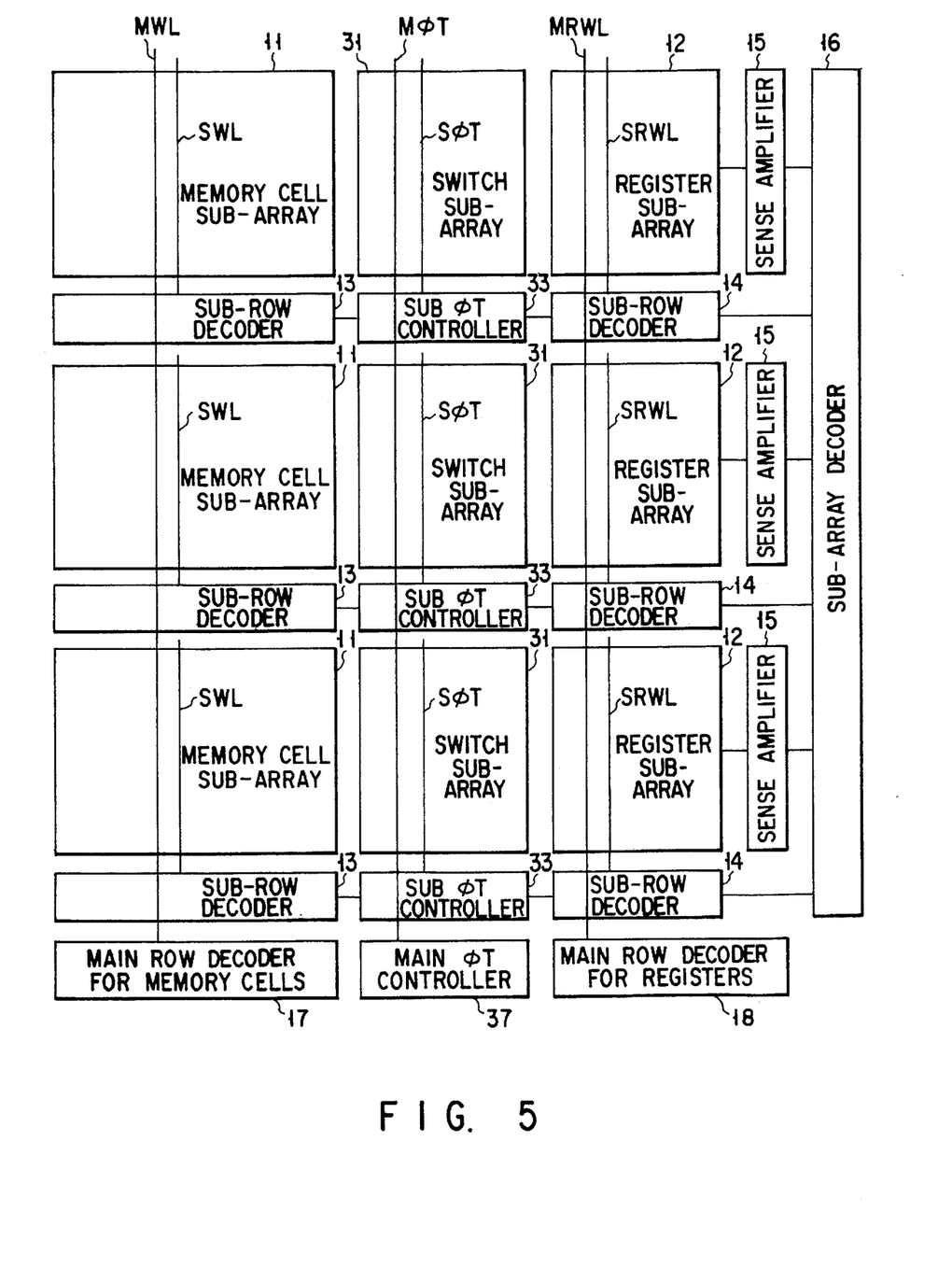
FIG. 5 is a schematic block diagram showing the arrangement of a semiconductor memory according to the second embodiment of the present invention.

FIG. 5 is a schematic block diagram showing a semiconductor memory according to the second embodiment of the present invention. The same reference numerals as in FIG. 3 denote the same parts in FIG. 5, and a description thereof will be omitted.

Figure 6:
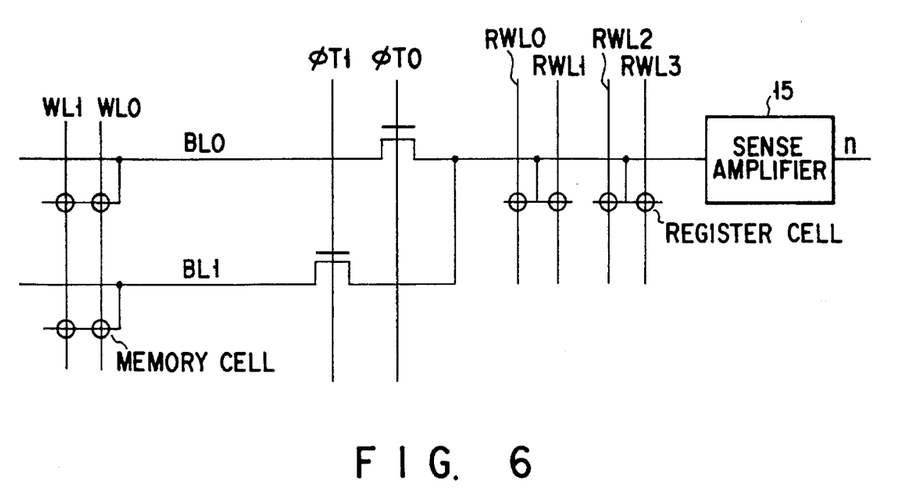
FIG. 6 is a view showing a connection state between the plurality of bit lines and one sense amplifier in the second embodiment.

In this embodiment, as in the first embodiment described above, switch sub-arrays 31 for selecting bit lines are respectively arranged between memory cell sub-arrays 11 and register sub-arrays 12. In addition, a sub $\phi T$ controller 33 is arranged in each switch sub-array 31, and a main $\phi T$ controller 37 is arranged. This arrangement constitutes a bit line selection circuit in which a plurality of bit lines are arranged to commonly use one sense amplifier, as shown in FIG. 6.

In this embodiment, in addition to a word line, a register word line, and a sense amplifier, a $\phi T$ signal for connecting a bit line and a sense amplifier is also selectively activated in each sub-array. In this manner, a current required for charging and discharging the $\phi T$ signal is also reduced. Therefore, as in the first embodiment, power consumption in data access can be considerably decreased.

(Third Embodiment)

Figure 7:
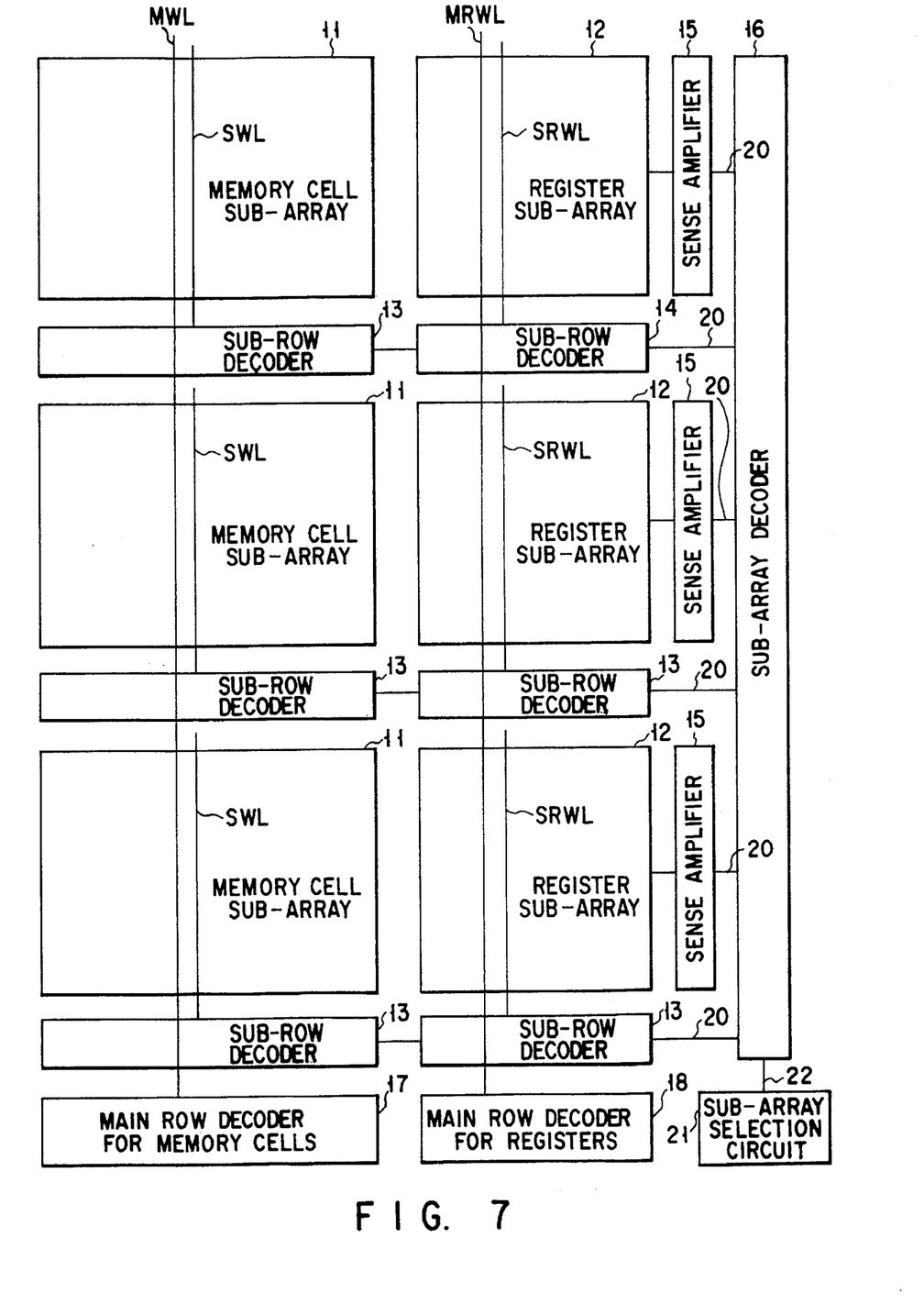
FIG. 7 is a schematic block diagram showing the arrangement of a semiconductor memory according to the third embodiment of the present invention.

FIG. 7 is a schematic block diagram showing a semiconductor memory according to the third embodiment of the present invention. The same reference numerals as in FIG. 3 denote the same parts in FIG. 7, and a description thereof will be omitted. Although this embodiment has an arrangement basically identical to the arrangement in FIG. 3, the arrangement of this embodiment has a sub-array selection circuit 21. Reference numeral 20 denotes a sub-array activation signal line; and 22, an all-sub-array activation signal line 22.

In a general DRAM, row addresses and column addresses are sequentially address-multiplexed and input to a semiconductor chip. In this embodiment, in order to achieve a high-speed operation and a low power consumption at once, when the row address of the first memory cell in a predetermined memory cell unit is input at the first timing, the sub-array selection circuit 21 detects that a sub-array to be activated is not determined, and the all-sub-array activation signal line 22 is activated.

In this manner, all the sub-arrays connected to a main word line selected in accordance with a row address are activated at once, and the data, of the first memory cell, read out onto the bit line is latched by the sense amplifier.

When a column address is input at the second timing, a sub-array selected using the column address is determined. The sub-array selection circuit 21 detects that the sub-array to be selected is determined, thereby making the all-sub-array activation signal line 22 inactive.

When the row address of the second memory cell in the same memory cell unit as described above is input at the third timing, the sub-array to be selected is determined as described above. For this reason, only a specific sub-array is activated.

As described above, according to this embodiment, when a sub-array to be selected is not determined, all the sub-arrays are activated, and data is latched by a sense amplifier. In this manner, data can be read out at a high speed when a sub-array to be selected is determined. Moreover, when a sub-array to be selected is determined, only the specific sub-array is activated. Therefore, a low power consumption can be realized.

When the above embodiment is used together with memory cells which are cascade-connected with each other as shown in FIG. 6 or 1, this arrangement can be considerably effective. That is, in a case wherein memory cells are cascade-connected with each other, since the memory cells cascade-connected with each other are generally sequentially accessed, the same memory cell sub-array is selected during this access cycle.

In addition, in a data refreshing operation, when the all-sub-array activation signal line 22 is activated by the sub-array selection circuit 21 in FIG. 7, all the sub-arrays can be refreshed at once. The number of refreshing operations can be reduced.

(Fourth Embodiment)

The fourth embodiment of the present invention will be described below. Although this embodiment is basically identical to the second embodiment, the fourth embodiment is described using a detailed circuit.

Figure 8:
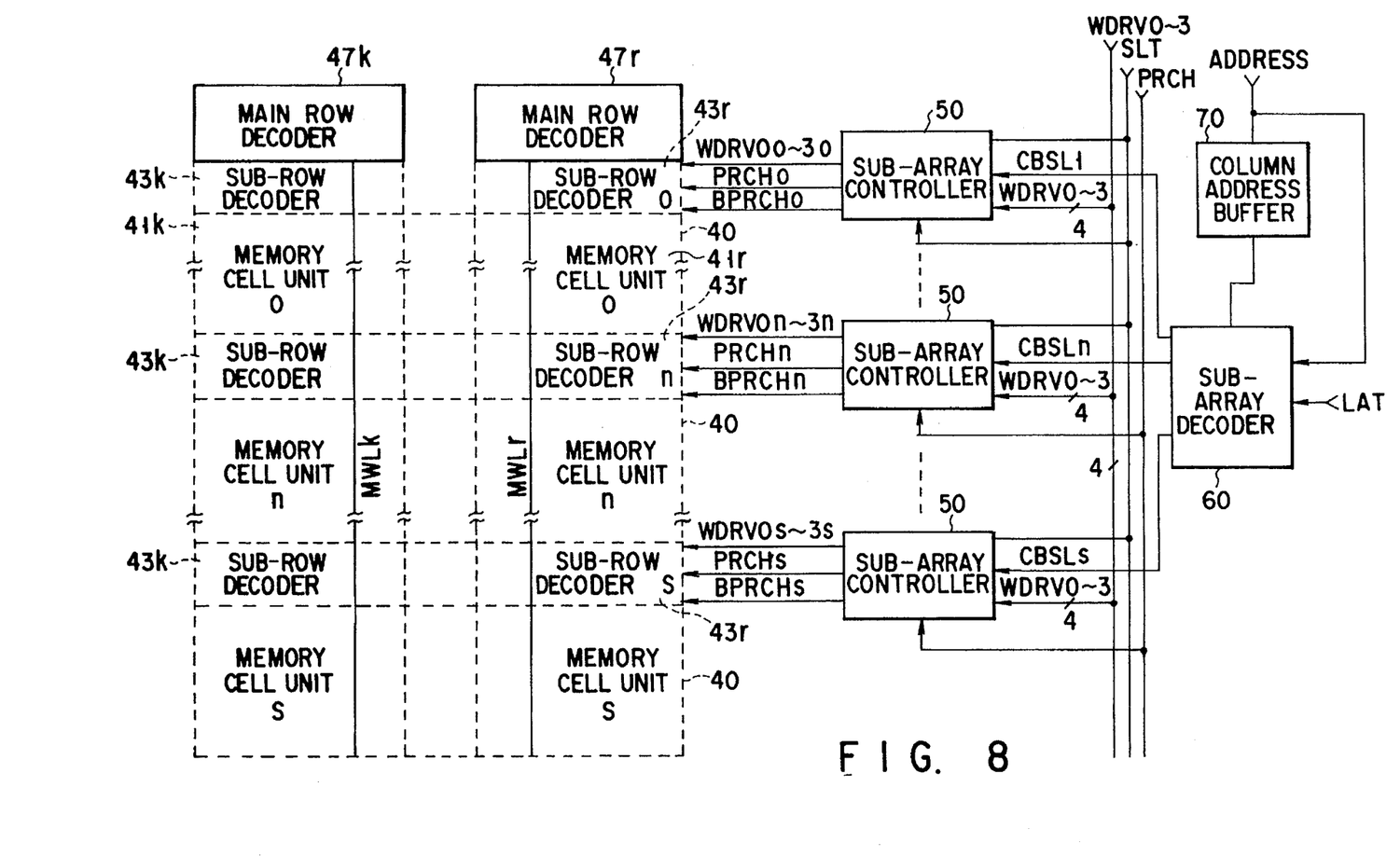
FIG. 8 is a schematic block diagram showing the arrangement of a semiconductor memory according to the fourth embodiment of the present invention.

FIG. 8 is a schematic block diagram showing the arrangement of a semiconductor memory according to the fourth embodiment of the present invention. When the fourth embodiment is to be described using a detailed circuit, a block arrangement is changed to easily understand the fourth embodiment. For this reason, in the fourth embodiment, blocks are divided in a manner different from that of each of the first and second embodiments. However, the system of the fourth embodiment is essentially identical to that of each of the first and second embodiments. Referring to FIG. 8, reference numeral 40 denotes a memory cell sub-array; 41 (41k and 41r), memory cell units; 43 (43k and 43r), sub-row decoders; 47 (47k and 47r), main row decoders; 50, a sub-array controller; 60, a sub-array decoder; and 70, a column address buffer.

The array of the memory cell units 41 each obtained by connecting a plurality of memory cells in series with each other is divided to form a plurality of sub-arrays 40. In each sub-array 40, the memory cell units 41 are divided on the left and right sides, and register cell units, sense amplifiers, equalizers, and the like are arranged between the memory cell units 41k and 41r. Assume that sub-arrays 40(0) to 40(s) are arranged in this embodiment. A sub-array 40(n) indicates an arbitrary sub-array which is arranged at the intermediate position between the sub-arrays 40(0) to 40(n).

All the sub-arrays 40 commonly have a main row decoder 47, and this main row decoder 47 is divided into row decoders 47k and 47r in correspondence with the division of the memory cell unit 41 into the left and right sides. In each of the row decoders 47k and 47r, one main word line (MWLk or MWLr) is selected by a row address. Each sub-array 40 has a sub-row decoder 43, and this sub-row decoder 43 is divided into sub-row decoders 43k and 43r in correspondence with the memory cell units 41k and 41r. The signal of a main word line MWL and signals WDRV0n to WDRV3n for selecting a cell in a memory cell unit select the word line of the memory cell of a corresponding one of the sub-arrays 40. Note that, in FIG. 8, the memory sub-arrays 40 and the sub-row decoders 43 are indicated by dotted lines to easily identify the main word lines MWL from each other.

Figure 9:
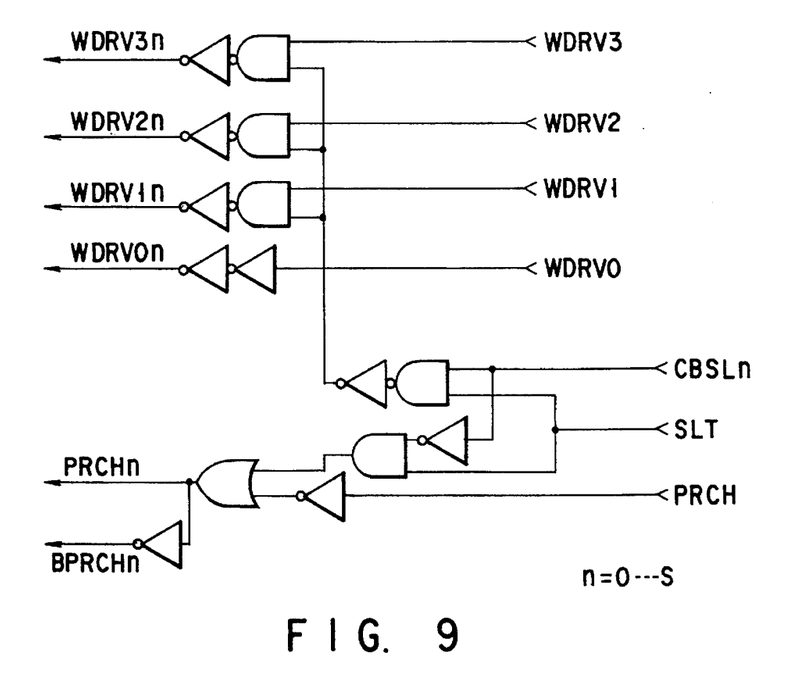
FIG. 9 is a circuit diagram showing the arrangement of a sub-array controller in the fourth embodiment.

The signals DRV0n to WDRV3n are generated by the sub-array controllers 50, and the sub-array controller 50 is arranged as shown in FIG. 9. In the sub-array controller 50, the logical AND between a signal CBSLn selected by the sub-array decoder 60 in accordance with a column address and a timing signal SLT for activating the second and sequential cells in the memory cell unit is calculated, and the logical AND between the above logical AND and the signals WDRV0 to WDRV3 for commonly performing timing control of the word lines in the memory cell units of all the memory cell arrays is calculated, thereby performing selection of the signals WDRV0 to WDRV3. The signals WDRV0 to WDRV3 are signals formed using, e.g., a counter circuit arranged inside the chip.

In addition, drive signals for registers for temporarily storing data and sense amplifiers which are required in this cell arrangement, signals for controlling connection between the sense amplifiers and bit lines, and the like are controlled in the same relationship as that of the word lines in each sub-block. These signals are controlled by signals PRCHn and BPRCHn formed by the circuit in FIG. 9 using a timing signal PRCH formed inside the chip, the signal CBSLn, and the signal SLT.

Figure 10:
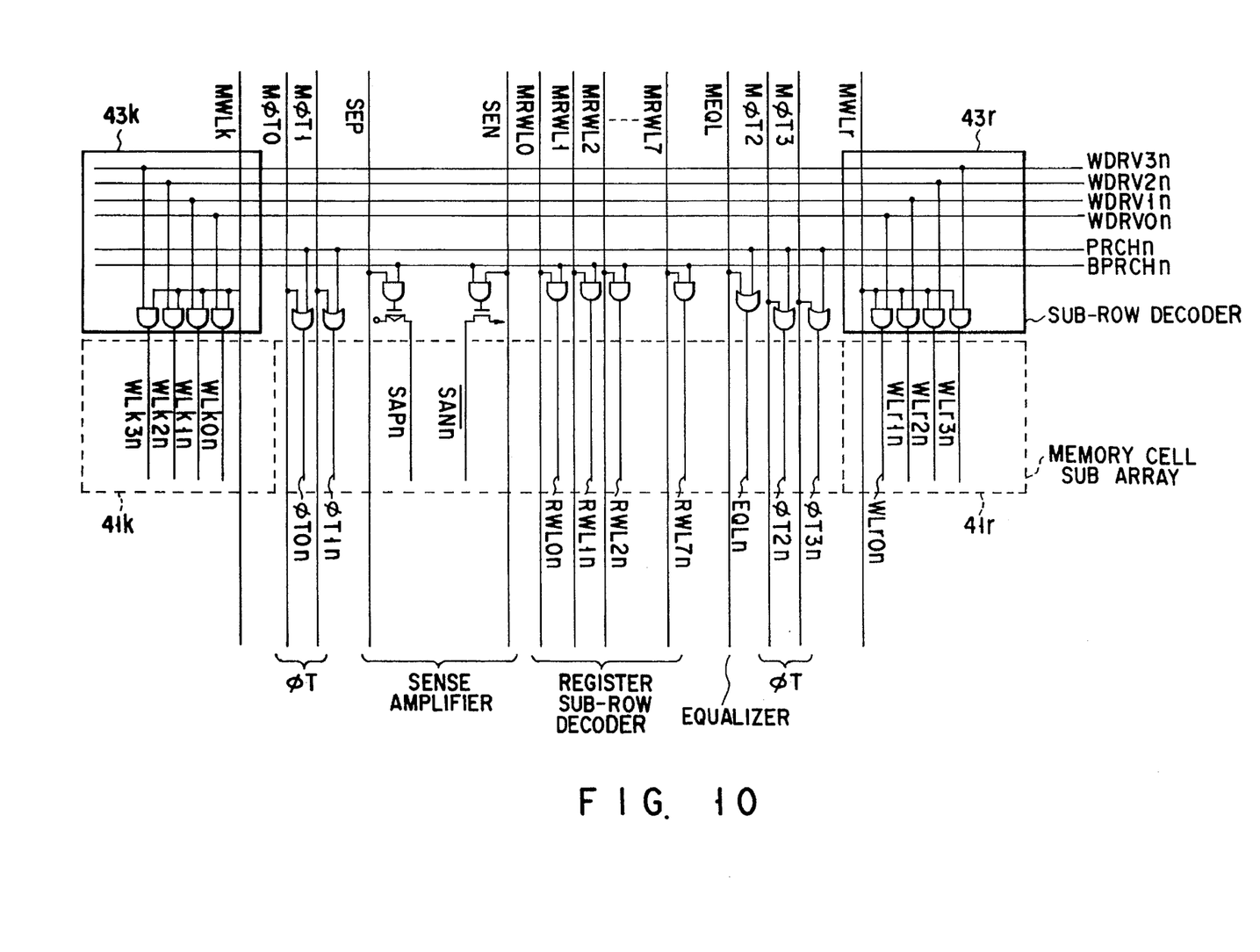
FIG. 10 is a circuit diagram showing a sub-row decoder, a register sub-row decoder, a sense amplifier, and part of a control circuit in the fourth embodiment.
Figure 11A:
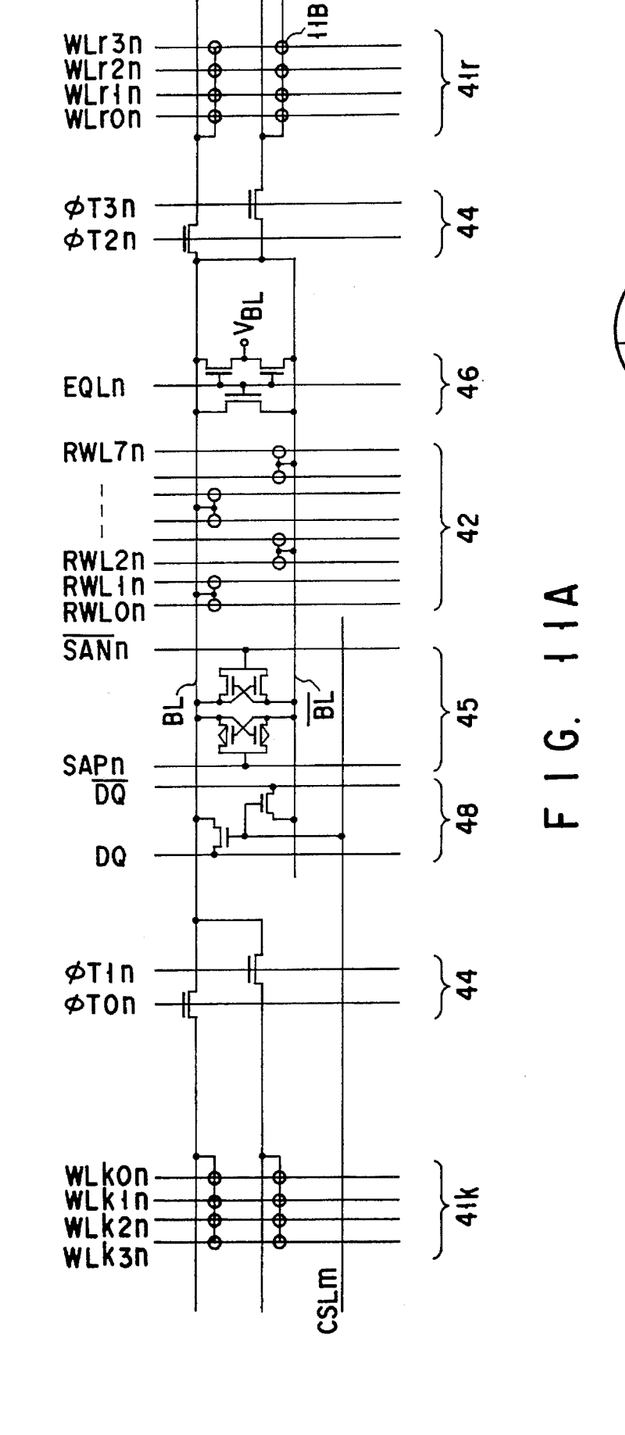
FIG. 11A is a circuit diagram showing a memory cell array, a register cell array, and the sense amplifier, and part of the control circuit in the fourth embodiment, and is continuous to FIG. 10.

FIG. 10 shows a circuit for controlling the output units (signals SEP and SEN) of the sense amplifiers of the sub-row decoders 43 and the memory sub-arrays 40, word lines (RWL0n to RWL3n) of register cells, an equalize signal EQLn, signals ($\phi$T0n to $\phi$T3n) for connecting the sense amplifiers to bit lines. The output signals shown in FIG. 9 are input to the upper right portion of the circuit shown in FIG. 10. The names of input and output signals are described in the upper side of FIG. 10, and signals whose names are described in the lower side of FIG. 10 are respectively connected to signals described in FIG. 11 and having the same names as described in the lower side of FIG. 10.

Figure 11B:
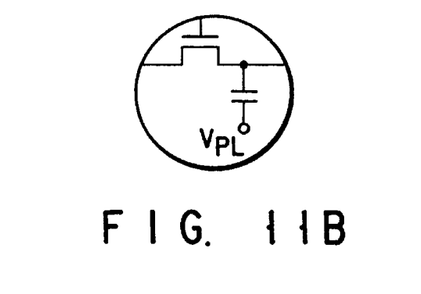
FIG. 11B is a circuit diagram showing a memory cell drawn as a circle 11B in FIG. 11A.

FIG. 11 shows the arrangement of the sub-array 40 in detail. For the descriptive convenience, this arrangement includes circuits such as a sense amplifier. More specifically, FIG. 11 shows a circuit constituted by the memory cell units 41k and 41r, a sense amplifier 45, a register cell unit 42, an equalizer 46, and a connection circuit (DQ gate) 48 for connecting the sense amplifier 45 to a data line DQ. In this case, each small circle indicates a memory cell. Bit lines to which the memory cell units 41k and 41r are connected through $\phi$T44 are represented by BL and $\overline{BL}$. The equalizer 46 is used to set the initial value of the pair of bit lines BL and $\overline{BL}$, and the initial value is input to a node VBL. The DQ gate is opened/closed by a signal CSLm.

Figure 12:
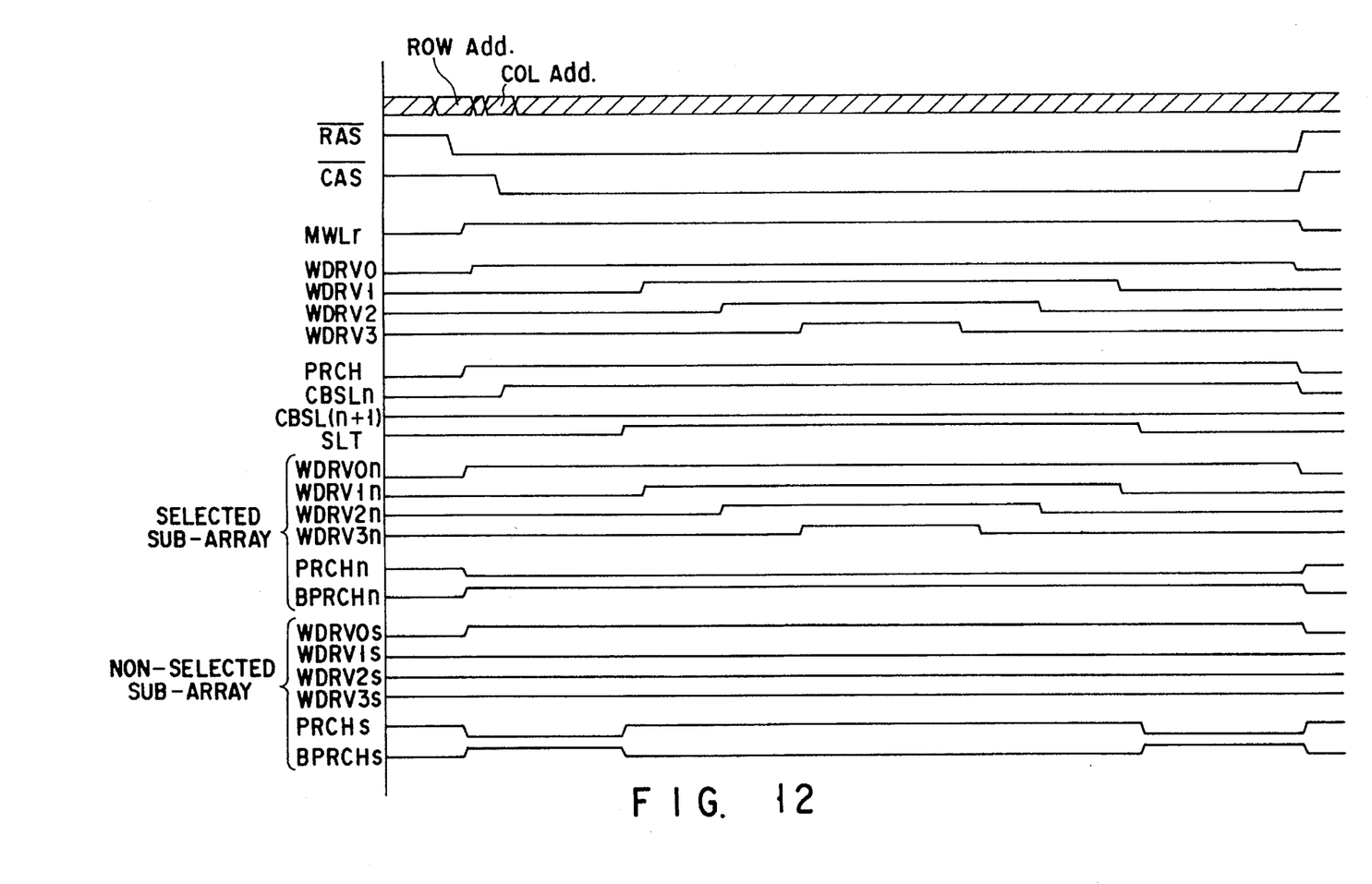
FIG. 12 is a signal waveform chart for explaining an operation of the fourth embodiment.

FIG. 12 shows a timing chart (signal waveform chart) of the circuits described above. A multiplexed address signal is demultiplexed to a main row decoder and a sub-array (column) decoder by a pulse signal called an $\overline{RAS}$ (Row Address Strobe) signal and a pulse signal called a signal CAS (Column Address Strobe). In this case, FIG. 12 shows a case wherein a sub-array n is selected by the column address.

The row address input first is transmitted to the main row decoder by the $\overline{RAS}$ signal to activate the main word line MWLr. At this time, the word line drive signal WDRV00 to WDRV0s and the signals PRCH shown in FIG. 8 are activated. In this manner, the word lines WL0 of all the memory cell units selected by the row address are activated, and data are read out from the word lines WL0. When the column address is input, this address signal is transmitted to the sub-array decoder by the CAS signal, and the sub-array selection signal CBSLn is activated. Only a sub-array n selected by this address is activated. When the word line drive signals WDRV1 to WDRV3 are sequentially activated, the word line drive signals WDRV1n to WDRV3n are sequentially activated. As a result, word lines WL1n, WL2n, and WL3n are sequentially activated, and data are read out from the word lines WL1n, WL2n, and WL3n. Word lines WL1, WL2, and WL3 of the remaining sub-arrays are not activated by the sub-array controller 50 (FIG. 9).

In this memory arrangement, since the memory cells are cascade-connected with each other, random bit access to a memory is very slowly performed. Therefore, the arrangement is preferably used such that a data rate is increased by serially reading out a large amount of data. For this purpose, it is preferable that the number of sub-arrays to be activated can be changed each time the memory cell arrangement is used.

Figure 13:
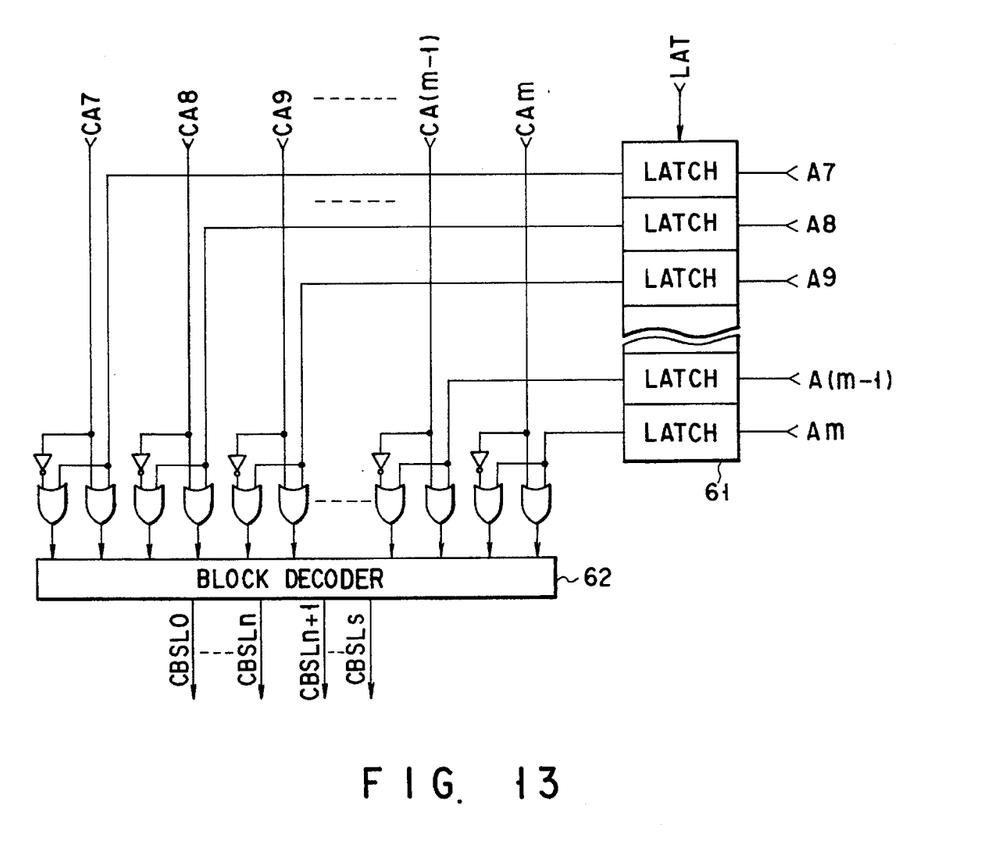
FIG. 13 is a circuit diagram for explaining the arrangement of a sub-array decoder for determining a sub-array size in the fourth embodiment.

For this reason, a device in which the number of sub-arrays to be activated at once is input in advance is arranged in this embodiment. FIG. 13 is a view showing the detailed arrangement of the control circuit (sub-array decoder) 60 for selecting a sub-array. This circuit is constituted by latch circuits 61, a block decoder 62, and various logical gates.

In this embodiment, the number of columns of one sub-array is set to be 128 ($=2^7$). For this reason, an address required for a signal for selecting a sub-array is upper than an 8th address bit (CA7). The number of arrays to be activated is input by an address pin before an address signal is input. In this embodiment, data are held in the latch circuits 61 by a latch signal LAT. The latch signal LAT may be formed by logically synthesizing signals such as RAS, CAS, WE (Write Enable), OE (Output Enable) signals with each other, or the latch signal LAT may be formed in synchronism with a clock as in a synchronous DRAM or a run-bus DRAM. For example, when two blocks are to be activated, a signal A7 (corresponding to 7 of row and column addresses) is input as "1", and the remaining signals are input as "0". Thereafter, when memory access is performed, an address input by the address bit CA7 is concealed by the signal A7. For this reason, the address bit CA7 is not selected, and the decoded signals are activated such that combinations (BLL0, CBL1), (CBL2, CBL3), . . . are formed. Similarly, when the addresses A7 and A8 are set to be "1", and the remaining addresses are set to be "0", the decoded signals are activated every four sub-arrays in combinations (CBL0, CBL1, CBL2, CBL3), . . . .

Although this embodiment has described a case wherein the number of arrays to be activated is input, the present invention can be applied to a case wherein another control scheme is input in advance. For example, a scheme for controlling the number of bits which are serially read out, the number of refreshing operations, the number of word lines to be activated in a memory cell unit, or the like is input in advance. The state in which such a control scheme is input in advance and the state in which blocks are separately driven may not be simultaneously satisfied.

In this embodiment, an address is input by RAS and CAS signals. However, in the present invention, access may be of a clock synchronization type or a packet transmission type. In addition, in this embodiment, although the number of sub-arrays to be activated at once is input through address pins, this number may be input through data input pins, data output pins, and data input/output pins.

The present invention is not limited to the embodiments described above. In each of the embodiments, although a dynamic semiconductor memory has been exemplified, the present invention can be applied to any nonvolatile semiconductor memory having a memory cell unit obtained by cascade-connecting a plurality of memory cells with each other.

As has been described above, according to the present invention, in a NAND cell array scheme in which a memory cell unit is constituted by cascade-connecting a plurality of memory cells with each other, an array of memory cells and an array of register cells are respectively divided into pluralities of sub-arrays, and the divided sub-arrays are selectively driven, so that a semiconductor memory capable of decreasing power consumption in data access can be realized.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory comprising:

a semiconductor substrate;

a memory cell array constituted by a plurality of memory cell units arranged on said semiconductor substrate in row and column directions, said memory cell units being arranged on said semiconductor substrate in rows and columns and each constituted by cascade-connecting a predetermined number of memory cells with each other, each of said memory cells being addressed by having a row address and a column address;

a plurality of bit lines to which said plurality of memory cell units are coupled in a column direction;

a plurality of sub word lines to which said plurality of memory cells are selectively coupled in a row direction;

a plurality of main word lines each of which selects a group of said sub word lines related to a memory cell unit in said memory cell arrays;

a plurality of register arrays in each of which a plurality of register cells for temporarily storing memory cell data read out from said plurality of memory cell units onto said bit lines are arranged;

a plurality of sense amplifiers for detecting the memory cell data;

a main row decoder for receiving the row address and selectively activating a corresponding one of said main word lines;

a main register row decoder for activating register word lines of said register arrays;

a sub-array decoder for receiving the column address and activating corresponding sense amplifiers from said sense amplifiers;

a plurality of sub-row decoders respectively connected to a plurality of memory cell sub-arrays obtained by dividing said memory cell array, each of said sub-row decoders being connected to said sub-array decoder and said main row decoder for selectively activating a corresponding one from said sub word lines; and a plurality of sub-register row decoders respectively connected to a plurality of register sub-arrays obtained by dividing said register array in correspondence with said plurality of memory cell sub-arrays, each of said sub-register row decoders being connected to said sub-array decoder and said register row decoder, and said register sub-arrays being respectively connected to said sense amplifiers, wherein said memory cell sub-arrays and said register sub-arrays are selectively driven by said sub-array decoder.

2. A memory according to claim 1, wherein when said sub-row decoder receives an activation signal from said main row decoder and selected by said sub-array decoder, said sub-row decoder sequentially activates said word lines of said memory cells constituting said memory cell unit corresponding to said sub-row decoder.

3. A memory according to claim 1, wherein, in accessing an arbitrary memory cell unit in said sub-arrays, said memory has an operation for, after said main row decoder and said sub-array decoder externally respectively receive the row address and the column address, selectively activating said sub-array having said memory cell unit of the addresses.

4. A memory according to claim 1, further comprising a sub-array selection circuit for, in accessing an arbitrary memory cell unit in said sub-arrays, activating all said sub-arrays when a first memory cell is to be accessed from said bit lines, and selectively activating said sub-array having said memory cell unit when second and sequential memory cells are accessed.

5. A memory according to claim 4, wherein said sub-array selection circuit controls said sub-array decoder to selectively activate said sub-array.

6. A memory according to claim 4, wherein said sub-array selection circuit controls said sub-row decoder and said sub-register row decoder to selectively activate said sub-array.

7. A memory according to claim 4, wherein said sub-array selection circuit receives a timing signal for informing that said second and sequential memory cells are accessed, calculates logical AND between the timing signal and a signal for selecting said sub-array, and calculating logical AND between the above logical AND and a signal for activating said word lines.

8. A memory according to claim 4, wherein said sub-array selection circuit activates all said sub-arrays in a refreshing operation.

9. A memory according to claim 1, wherein, in accessing said arbitrary memory cell unit in said sub-arrays, said memory has an operation for, when the row address is received by said main row address decoder when said first memory cell is to be accessed, activating all said sub-arrays corresponding to the row address and reading out data held in said selected memory cells to said sense amplifiers, an operation for reading out, from said sense amplifiers, data held in a memory cell corresponding to said column address which is externally input, and an operation for activating only said sub-array which is designated in advance with respect to said second and sequential memory cells.

10. A memory according to claim 1, wherein said memory cell units are of a dynamic type.

11. A memory according to claim 1, wherein said sub-row decoder drives said memory cell unit selected by said main row decoder in said sub-array selected by said sub-array decoder, and said sub-register row decoder drives said register cell selected by said register row decoder in said sub-array selected by said sub-array decoder.

12. A memory according to claim 1, wherein said sub-array decoder can externally set the number of sub-arrays which can be activated at once.

13. A memory according to claim 1, wherein said sub-array decoder can activate 2n (n=0, 1, 2, . . . ) sub-arrays at once.

14. A memory according to claim 1, further comprising a sub-array of a bit line selection circuit for connecting a predetermined bit line of said plurality of bit lines to a corresponding one of said register arrays in correspondence with said sub-arrays.

15. A semiconductor memory comprising:

a semiconductor substrate;

a memory cell array having a plurality of memory cell sub-arrays, each of said sub-arrays constituted by a plurality of memory cell units arranged on said semiconductor substrate, each of said memory cell units being constituted by cascade-connecting a predetermined number of memory cells with each other, each of said memory cells being selected by a row address and a column address;

a plurality of bit lines to which said plurality of memory cell units are coupled;

a plurality of sub word lines to which said plurality of memory cells are coupled;

a plurality of main word lines each of which selects a group of said sub word lines related to a memory cell unit in said memory cell arrays;

a main row decoder for receiving the row address and selectively activating a corresponding one of said main word lines;

a plurality of sub-row decoders respectively connected to a plurality of memory cell sub-arrays, each of said sub-row decoders for activating said sub word lines related to said memory cell unit of corresponding memory cell sub-array; and a sub-array decoder for activating corresponding one of said sub-row decoders;

wherein in accessing an arbitrary memory cell unit in said sub-arrays, all said sub-arrays determined by said row address being activated when a first memory cell is to be accessed, and one or ones among all said sub-array being selectively activated when second and sequential memory cells are accessed.

16. A memory according to claim 15, wherein when said sub-row decoder receives an activation signal from said main row decoder and selected by said sub-array decoder, said sub-row decoder sequentially activates said word lines of said memory cells constituting said memory cell unit corresponding to said sub-row decoder.

17. A memory according to claim 15, further comprising a sub-array selection circuit for, in accessing said arbitrary memory cell unit in said sub-arrays, activating all said sub-arrays when the first memory cell is to be accessed from said bit lines, and selectively activating said sub-array having said memory cell unit when the second and sequential memory cells are accessed.

18. A memory according to claim 17, wherein said sub-array selection circuit controls said sub-array decoder to selectively activate said sub-array.

19. A memory according to claim 17, wherein said sub-array selection circuit controls said sub-row decoder to selectively activate said sub-array.

20. A memory according to claim 17, wherein said sub-array selection circuit receives a timing signal for informing that said second and sequential memory cells are accessed, calculates logical AND between the timing signal and a signal for selecting said sub-array, and calculating logical AND between the above logical AND and a signal for activating said word lines.

21. A memory according to claim 17, wherein said sub-array selection circuit activates all said sub-arrays in a refreshing operation.

22. A memory according to claim 15, further comprising a plurality of sense amplifiers for detecting memory cell data held in said memory cells, wherein, in accessing said arbitrary memory cell unit in said sub-arrays, said memory has an operation for, when the row address is received by said main row address decoder when said first memory cell is to be accessed, activating all said sub-arrays corresponding to the row address and reading out data held in said selected memory cells to said sense amplifiers, an operation for reading out, from said sense amplifiers, data held in a memory cell corresponding to said column address which is externally input, and an operation for activating only said sub-array which is designated in advance with respect to said second and sequential memory cells.

23. A memory according to claim 15, wherein said memory cell units are of a dynamic type.

24. A memory according to claim 15, further comprising:

a plurality or register arrays in each of which a plurality of register cells for temporarily storing memory cell data read out from said plurality of memory cell units onto said bit lines are arranged;

a plurality of sense amplifiers for detecting the memory cell data;

a main register row decoder for activating register word lines of said register arrays; and a plurality of sub-register row decoders respectively connected to a plurality of register sub-arrays obtained by dividing said register array in correspondence with said plurality of memory cell sub-arrays, each of said sub-register row decoders being connected to said sub-array decoder and said register row decoder, and said register sub-arrays being respectively connected to said sense amplifiers, wherein said sub-row decoder drives said memory cell unit selected by said main row decoder in said sub-array selected by said sub-array decoder, and said sub-register row decoder drives said register cell selected by said register row decoder in said sub-array selected by said sub-array decoder.

25. A memory according to claim 15, wherein said sub-array decoder can externally set the number of sub-arrays which can be activated at once.

26. A memory according to claim 15, wherein said sub-array decoder can activate 2n (n=0, 1, 2, ...) sub-arrays at once.

27. A memory according to claim 15, further comprising:

a plurality of register arrays in each of which a plurality of register cells for temporarily storing memory cell data read out form said plurality of memory cell units onto said bit lines are arranged; and a sub-array of a bit line selection circuit for connecting a predetermined bit line of said plurality of bit lines to a corresponding one of said register arrays in correspondence with said sub-arrays.

\* \* \* \* \*